(12) United States Patent
Tateishi (10) Patent No.: US 9,935,008 B2
(45) Date of Patent: Apr. 3, 2018

(54) SEMICONDUCTOR DEVICE CHIP MANUFACTURING METHOD

(71) Applicant: DISCO CORPORATION, Tokyo (JP)

(72) Inventor: Toshiyuki Tateishi, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/633,138

(22) Filed: Jun. 26, 2017

(65) Prior Publication Data

US 2018/0012804 A1    Jan. 11, 2018

(30) Foreign Application Priority Data

Jul. 6, 2016    (JP) .................................. 2016-134469

(51) Int. Cl.
  *H01L 21/00*    (2006.01)
  *H01L 21/78*    (2006.01)
  *H01L 23/00*    (2006.01)

(52) U.S. Cl.
  CPC ............ *H01L 21/78* (2013.01); *H01L 23/562* (2013.01)

(58) Field of Classification Search
  CPC .............................. H01L 21/78; H01L 23/562
  See application file for complete search history.

(56) References Cited

U.S. PATENT DOCUMENTS

| 9,627,242 | B2 * | 4/2017 | Nakamura | .......... H01L 21/6836 |
| 9,748,182 | B2 * | 8/2017 | Nakamura | .......... H01L 21/3065 |
| 2009/0149002 | A1 * | 6/2009 | Watanabe | .......... B23K 26/0057 438/463 |

FOREIGN PATENT DOCUMENTS

| JP | 2009-076731 A | 4/2009 |
| WO | WO 03/077295 A1 | 9/2003 |

* cited by examiner

*Primary Examiner* — Richard Booth
(74) *Attorney, Agent, or Firm* — Greer Burns & Crain Ltd.

(57) ABSTRACT

Disclosed herein is a semiconductor device chip manufacturing method including a chipping prevention layer forming step of forming a chipping prevention layer at each intersection of a plurality of crossing division lines formed on the front side of a wafer, a modified layer forming step of applying a laser beam having a transmission wavelength to the wafer to the back side thereof along each division line in the condition where the focal point of the laser beam is set inside the wafer, thereby forming a modified layer inside the wafer along each division line, and a dividing step of grinding the back side of the wafer after performing the modified layer forming step, thereby reducing the thickness of the wafer and also dividing the wafer into individual semiconductor device chips along each division line where the modified layer is formed as a break start point.

3 Claims, 6 Drawing Sheets

SEMICONDUCTOR DEVICE CHIP MANUFACTURING METHOD

BACKGROUND OF THE INVENTION

Field of the Invention

The present invention relates to a semiconductor device chip manufacturing method for dividing a semiconductor wafer formed of silicon to obtain individual semiconductor device chips.

Description of the Related Art

As a method of dividing a semiconductor wafer formed of silicon to obtain individual semiconductor device chips, a processing method using a laser beam is known (e.g., Japanese Patent No. 3762409). This processing method includes the steps of applying a laser beam having a transmission wavelength to the wafer to the back side thereof along each division line in the condition where the focal point of the laser beam is set inside the wafer, thereby forming a modified layer due to multiphoton absorption inside the wafer and next grinding the back side of the wafer to thereby reduce the thickness of the wafer and also divide the wafer into the individual semiconductor device chips where the modified layer is formed as a break start point. This processing method is sometimes called stealth dicing before grinding (SDBG).

In the processing method by SDBG, the wafer is divided, by applying a grinding pressure to the wafer, into the individual semiconductor device chips where the modified layer is formed as a break start point, a crack being generated by breaking between any adjacent ones of the semiconductor device chips. This crack is only a small gap, so that there is a possibility that the adjacent device chips may rub against each other. In particular, the corners of the adjacent device chips come into point contact with each other, causing a problem such that damage such as chipping due to the contact of the corners of the device chips may easily occur.

A general silicon wafer to be used in manufacturing semiconductor device chips has a principal surface in a (100) plane. Recently, the use of a silicon wafer having a principal surface in a (110) plane has been examined because a driving current for a positive metal-oxide semiconductor field-effect transistor (PMOSFET) or the like can be improved.

In such a silicon wafer having a principal surface in a (110) plane, crossing division lines are formed on the front side of the wafer so as to be inclined 45 degrees with respect to a <100> direction as a crystal orientation (45-degree product wafer). Further, in a silicon wafer having a principal surface in a (100) plane and also having a notch indicating a <011> direction as a crystal orientation, crossing division lines are set so as to be inclined 45 degrees with respect to a line connecting the center on the principal surface of the wafer and the notch. This silicon wafer is effective in increasing the speed of the devices and reducing the power consumption of the devices, and it is also adopted as a 45-degree product wafer.

SUMMARY OF THE INVENTION

In the semiconductor device chip manufacturing method using SDBG, damage such as chipping easily occurs at the corners of the device chips as mentioned above. Particularly in the 45-degree product wafer having the division lines inclined 45 degrees with respect to the <100> direction as a crystal orientation, the crack generated from the corners of the device chips easily extends toward the corresponding devices.

It is therefore an object of the present invention to provide a semiconductor device chip manufacturing method which can prevent the occurrence of chipping at the corners of individual semiconductor device chips due to the contact thereof after dividing a silicon wafer into the device chips.

In accordance with an aspect of the present invention, there is provided a semiconductor device chip manufacturing method comprising a device forming step of forming a plurality of devices on the front side of a wafer formed of silicon, the front side of the wafer being partitioned by a plurality of crossing division lines to thereby define a plurality of separate regions where the respective devices are formed; a chipping prevention layer forming step of forming a chipping prevention layer at each intersection of the crossing division lines formed on the front side of the wafer; a protective tape attaching step of attaching a protective tape to the front side of the wafer after performing the device forming step and the chipping prevention layer forming step; a modified layer forming step of applying a laser beam having a transmission wavelength to the wafer to the back side thereof along each division line in the condition where the focal point of the laser beam is set inside the wafer after performing the protective tape attaching step, thereby forming a modified layer inside the wafer along each division line; and a dividing step of grinding the back side of the wafer after performing the modified layer forming step, thereby reducing the thickness of the wafer and also dividing the wafer into individual semiconductor device chips where the modified layer is formed as a break start point. The chipping prevention layer functions to prevent the occurrence of chipping due to rubbing of the corners of any adjacent ones of the semiconductor device chips.

Preferably, the chipping prevention layer is selected from the group consisting of a metal film, nitride film, oxide film, diamond-like carbon (DLC) film, and passivation film. Preferably, the crossing division lines extend so as to be inclined 45 degrees with respect to a notch or orientation flat formed on the wafer.

According to the semiconductor device chip manufacturing method of the present invention, the chipping prevention layer is previously formed at each intersection of the crossing division lines before dividing the wafer into the device chips, wherein the intersection corresponds to the corners of the device chips to be formed from the wafer. Accordingly, even when the adjacent device chips come into contact with each other after dividing the wafer, it is possible to prevent the occurrence of chipping of the corners of the device chips.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
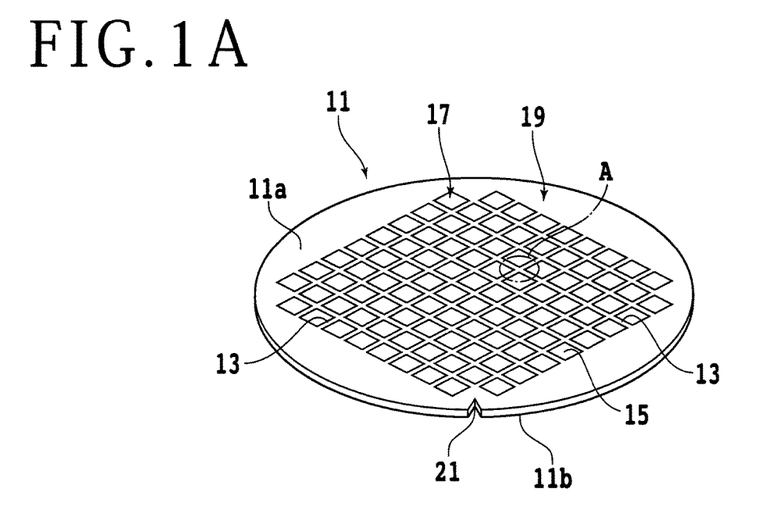
FIG. 1A is a perspective view of a 45-degree product silicon wafer as viewed from the front side thereof.

A preferred embodiment of the present invention will now be described in detail with reference to the drawings. Referring to FIG. 1A, there is shown a perspective view of a silicon wafer 11 as viewed from the front side thereof. The silicon wafer 11 (which will be hereinafter referred to also simply as wafer 11) is formed from a silicon substrate having a principal surface in a (110) plane. A plurality of semiconductor devices 15 are formed on the front side of the silicon substrate. A notch 21 is formed on the outer circumference of the silicon wafer 11 so as to indicate a <100> direction as a crystal orientation.

In the semiconductor device chip manufacturing method according to a preferred embodiment of the present invention, a device forming step is first performed in such a manner that the semiconductor devices 15 are formed on the front side of a semiconductor substrate having a crystal orientation in the <100> direction by a photolithography technique, wherein the front side of the semiconductor substrate is partitioned by a plurality of crossing division lines 13 to define a plurality of separate regions where the respective plural semiconductor devices 15 are formed. In the device forming step according to the present embodiment, the crossing division lines 13 are formed to be inclined 45 degrees with respect to the <100> direction as the crystal orientation indicated by the notch 21 (45-degree product wafer).

Figure 1B:
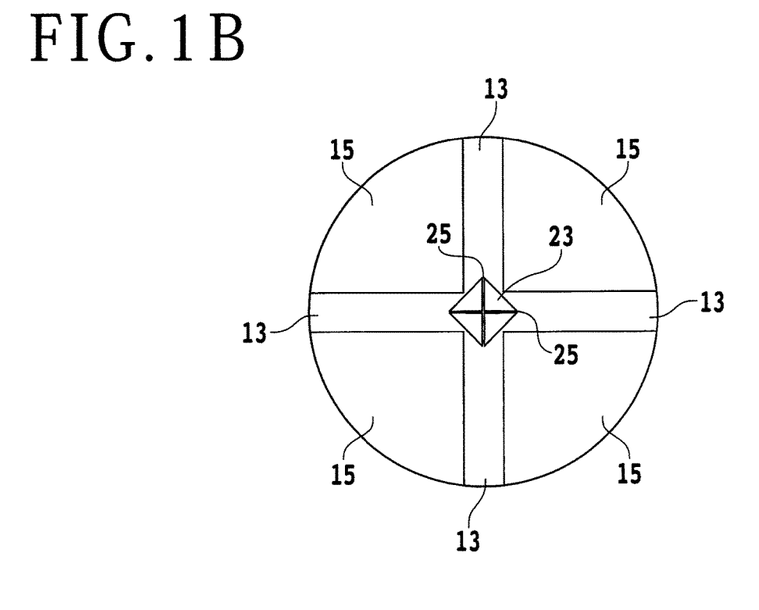
FIG. 1B is an enlarged view of an encircled part A shown in FIG. 1A.

The silicon wafer 11 has a front side 11a and a back side 11b. The front side 11a of the silicon wafer 11 is composed of a device area 17 where the plural semiconductor devices 15 are formed and a peripheral marginal area 19 surrounding the device area 17. The silicon (Si) substrate forming the silicon wafer 11 is exposed to the back side 11b of the silicon wafer 11. In the semiconductor device chip manufacturing method according to this preferred embodiment, a chipping prevention layer forming step is performed simultaneously with the device forming step using photolithography mentioned above. In the chipping prevention layer forming step, a chipping prevention layer 23 is formed at each intersection of all the crossing division lines 13 as shown in FIG. 1B.

Preferably, the chipping prevention layer 23 is formed from a metal film, nitride film, oxide film, DLC film, or passivation film. Preferably, the chipping prevention layer 23 is formed with a pair of crossing grooves 25 aligned with the corresponding crossing division lines 13. The bottom of each groove 25 is exposed to the upper surface of each division line 13. That is, one of the crossing grooves 25 coincides with the center line of the corresponding division line 13 extending in a particular direction, and the other groove 25 coincides with the center line of the corresponding division line 13 extending in a direction perpendicular to the particular direction.

Figure 2:
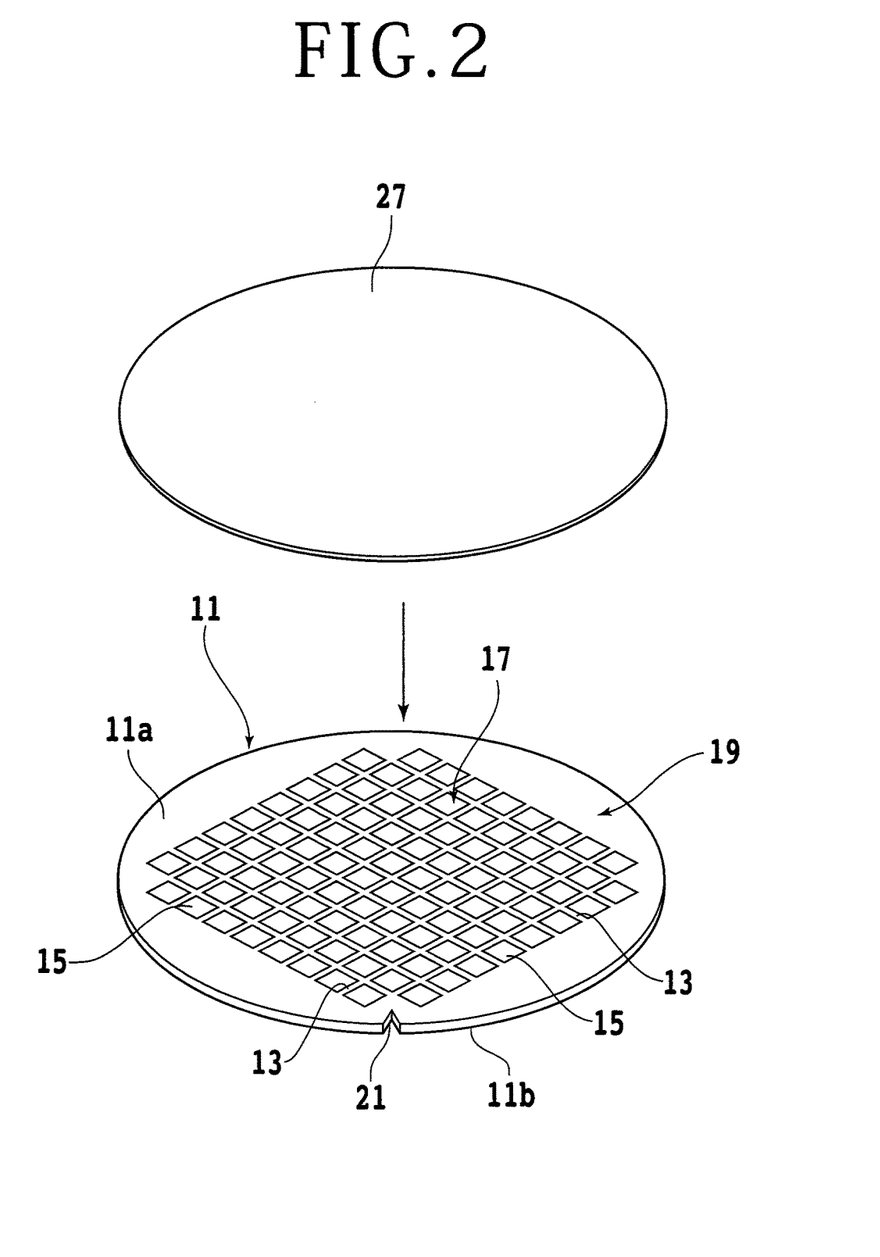
FIG. 2 is a perspective view showing a protective tape attaching step.
Figure 3:
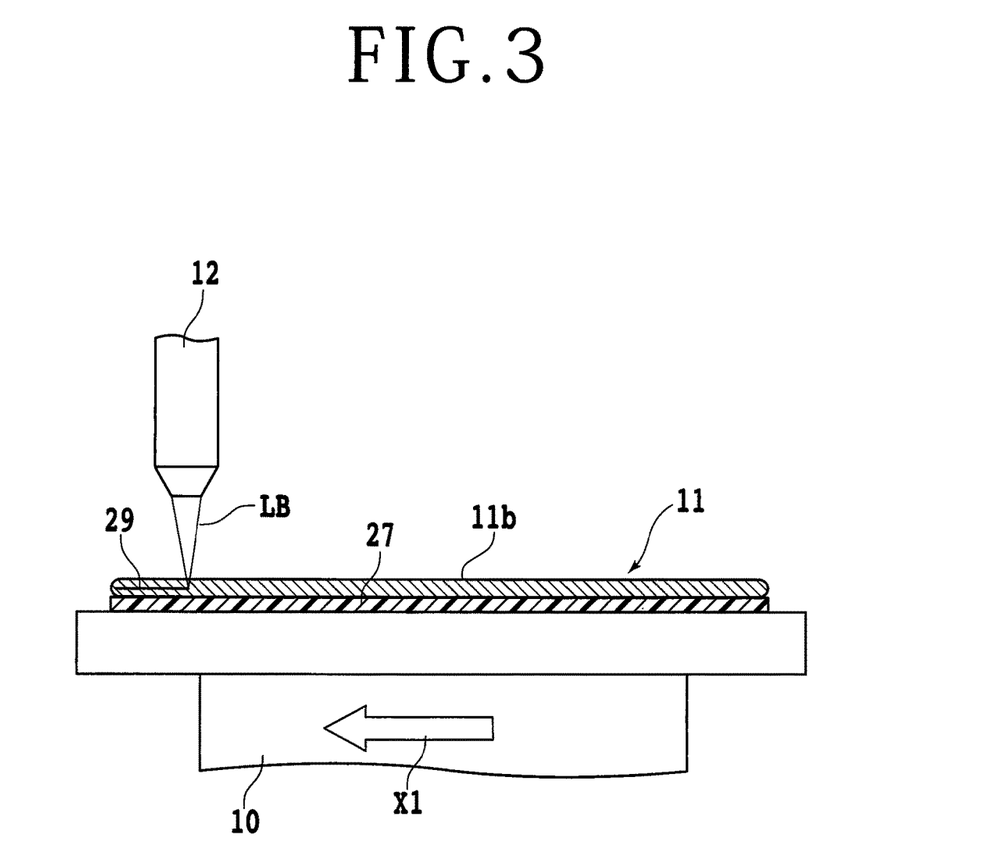
FIG. 3 is a partially sectional side view showing a modified layer forming step.

After performing the device forming step and the chipping prevention layer forming step, a protective tape attaching step is performed in such a manner that a protective tape 27 is attached to the front side 11a of the silicon wafer 11 as shown in FIG. 2. After performing the protective tape attaching step, a modified layer forming step is performed as shown in FIG. 3. First, the silicon wafer 11 with the protective tape 27 attached thereto is held under suction on a chuck table 10 included in a laser processing apparatus in the condition where the protective tape 27 is in contact with the upper surface of the chuck table 10. Accordingly, the back side 11b of the silicon wafer 11 held on the chuck table 10 is exposed.

Thereafter, a laser beam LB having a transmission wavelength to the silicon wafer 11 is applied from focusing means 12 included in the laser processing apparatus to the back side 11b of the wafer 11 in the condition where the focal point of the laser beam LB is set inside the wafer 11, and the chuck table 10 is fed in the direction shown by an arrow X1 as a feeding direction, which is parallel to the division line 13. Accordingly, a modified layer forming step is performed in such a manner that a modified layer 29 due to multiphoton absorption is formed inside the wafer 11 along the predetermined division line 13.

Thereafter, this modified layer forming step is similarly performed along all of the other division lines 13 extending in the first direction as indexing the chuck table 10 in the direction perpendicular to the feeding direction. Thereafter, the chuck table 10 is rotated 90 degrees to form a plurality of similar modified layers 29 inside the wafer 11 along all of the division lines 13 extending in the second direction perpendicular to the first direction.

For example, the modified layer forming step is performed under the following laser processing conditions.

Figure 4:
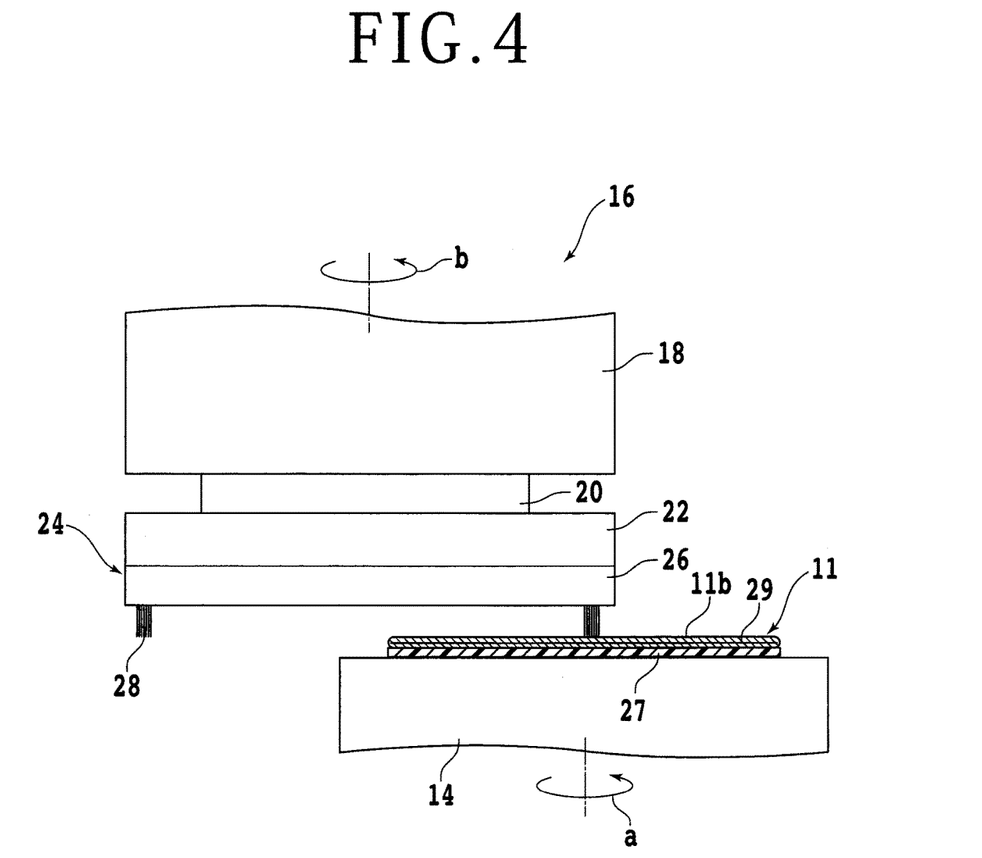
FIG. 4 is a partially sectional side view showing a dividing step.

Light source: YAG pulsed laser
Wavelength: 1,342 nm
Average power: 0.8 W
Repetition frequency: 60 kHz
Spot diameter: 1.5 μm
Feed speed: 700 mm/second After performing the modified layer forming step, a dividing step is performed in such a manner that the back side 11b of the wafer 11 is ground to thereby reduce the thickness of the wafer 11 and simultaneously divide the wafer 11 into individual semiconductor device chips along the modified layers 29 as a break start point. More specifically, as shown in FIG. 4, the silicon wafer 11 is held under suction on a chuck table 14 included in a grinding apparatus in the condition where the protective tape 27 is in contact with the upper surface of the chuck table 14. Accordingly, the back side 11b of the silicon wafer 11 held on the chuck table 14 is exposed.

As shown in FIG. 4, a grinding unit 16 in the grinding apparatus includes a spindle housing 18, a spindle 20 rotatably supported to the spindle housing 18, a motor (not shown) for rotationally driving the spindle 20, a wheel mount 22 connected to the lower end of the spindle 20, and a grinding wheel 24 detachably mounted to the lower surface of the wheel mount 22 by using screws (not shown). The grinding wheel 24 is composed of an annular grinding base 26 and a plurality of abrasive members 28 fixed to the lower surface of the grinding base 26.

In the dividing step, the chuck table 14 is rotated at 300 rpm, for example, in the direction shown by an arrow a. At the same time, the grinding wheel 24 is also rotated at 6000 rpm, for example, in the same direction as the rotational direction of the chuck table 14, i.e., in the direction shown by an arrow b. Further, a grinding unit feeding mechanism (not shown) is operated to make the abrasive members 28 of the grinding wheel 24 to come into contact with the back side 11b of the silicon wafer 11. Thereafter, the grinding wheel 24 is further fed by a predetermined amount at a predetermined feed speed to thereby grind the back side 11b of the wafer 11, thereby reducing the thickness of the wafer 11 to a predetermined finished thickness. During this grinding of the back side 11b of the wafer 11, a predetermined grinding pressure is always applied from the abrasive members 28 to the back side 11b of the wafer 11. Accordingly, the wafer 11 is divided (broken) into individual semiconductor device chips 33 along the modified layers 29 as a break start point before being thinned into the predetermined finished thickness.

Figure 5:
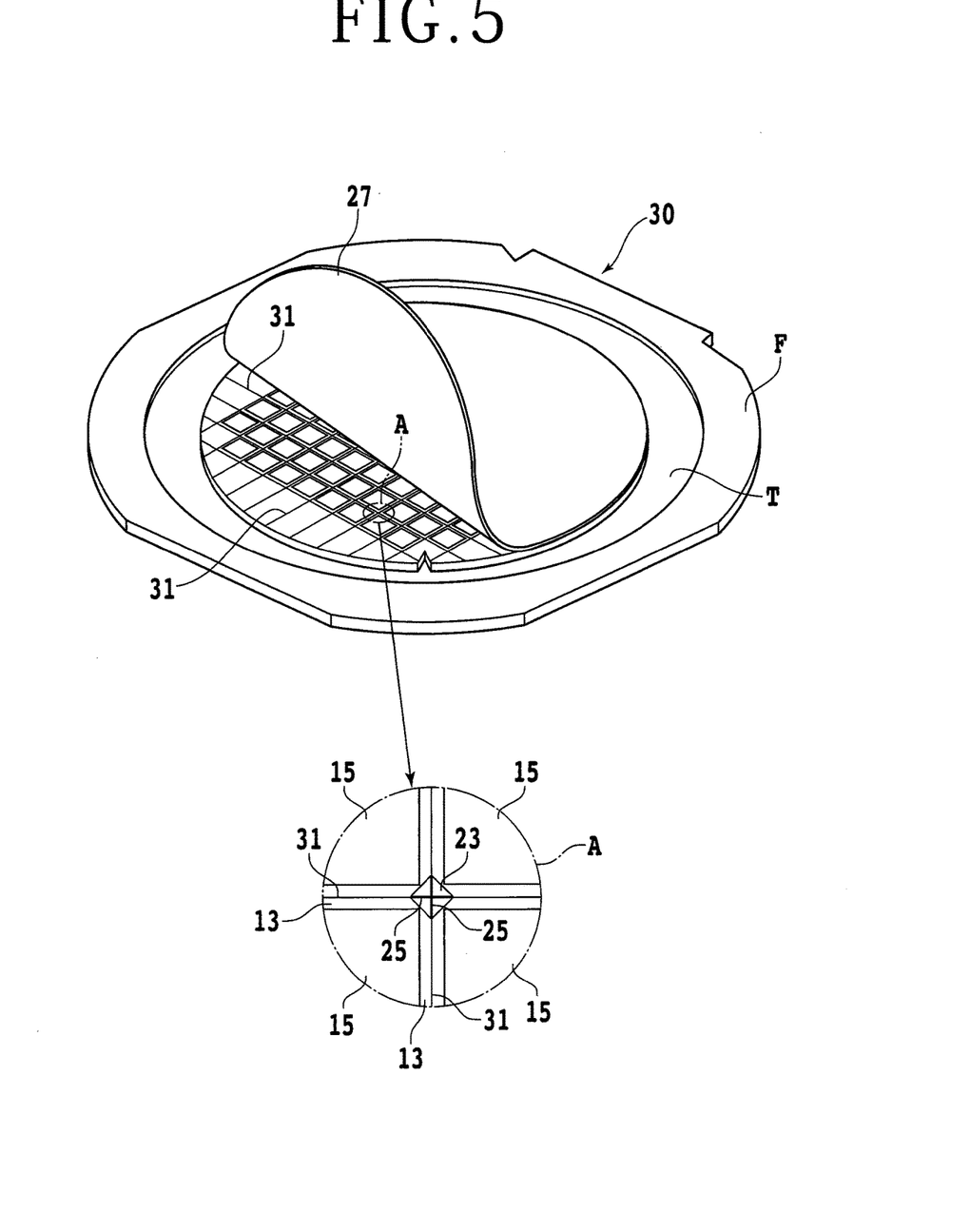
FIG. 5 is a perspective view showing a tape changing step.

More specifically, as shown in an enlarged view of an encircled part A in FIG. 5, a crack 31 is formed along the center line of each division line 13 where the modified layer 29 is formed as a break start point, by grinding the wafer 11 as mentioned above. That is, the wafer 11 is divided by the cracks 31 respectively corresponding to all the division lines 13, thereby obtaining a plurality of individual device chips 33. As described above, the chipping prevention layer 23 formed at each intersection of the crossing division lines 13 has the crossing grooves 25 coinciding with the center lines of the corresponding crossing division lines 13. Accordingly, there is no possibility that the chipping prevention layer 23 may interfere with the division of the wafer 11 into the individual device chips 33. That is, by grinding the back side 11b of the wafer 11 under a predetermined grinding pressure, the wafer 11 can be divided into the individual device chips 33.

At the time the dividing step is finished, the crack 31 as a small gap generated by the breaking of the wafer 11 is only present between any adjacent ones of the device chips 33, so that there is a possibility that the adjacent device chips 33 may rub against each other. However, according to this preferred embodiment, the chipping prevention layer 23 is formed at the corners of each semiconductor device chip 33, thereby preventing damage such as chipping due to the rubbing of the corners of the adjacent device chips 33. As described above, the silicon wafer 11 in this preferred embodiment is a so-called 45-degree product wafer such that the division lines 13 are inclined 45 degrees with respect to the notch 21 indicating the <100> direction as a crystal orientation. In this case, there is a problem such that a crack generated from the corners of each semiconductor device chip 33 may easily extent toward the corresponding device 15. However, according to this preferred embodiment, the chipping prevention layer 23 can prevent the occurrence of chipping at the corners of each device chip 33, thereby eliminating the above problem.

After performing the dividing step, the wafer 11 is transferred to an expanding apparatus, so as to increase the spacing between the adjacent device chips 33. Prior to transferring the wafer 11 to the expanding apparatus, a tape changing step is performed as shown in FIG. 5 in such a manner that the back side 11b of the wafer 11 is attached to an expansion tape T supported at its peripheral portion to an annular frame F and the protective tape 27 is next peeled from the front side 11a of the wafer 11, thus forming a frame unit 30.

Figure 6A:
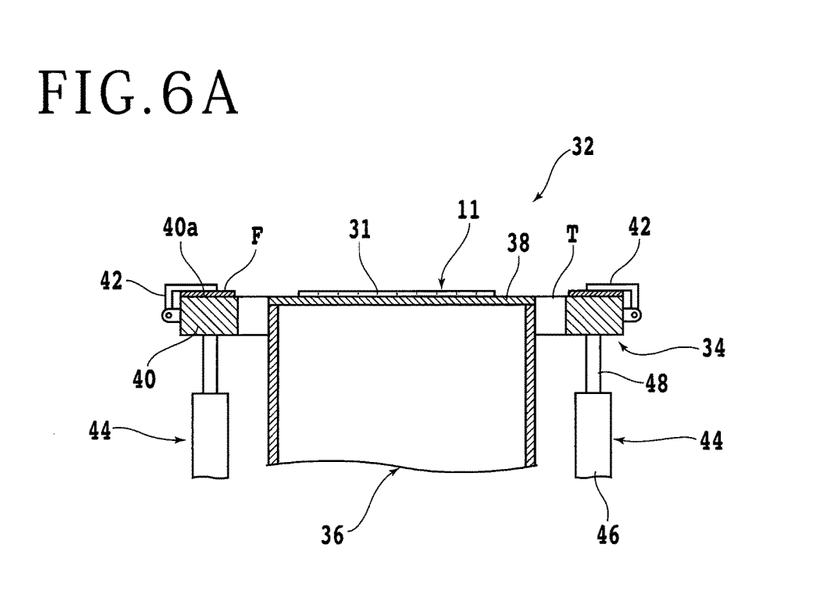
FIGS. 6A and 6B are sectional views showing an expanding step.
Figure 6B:
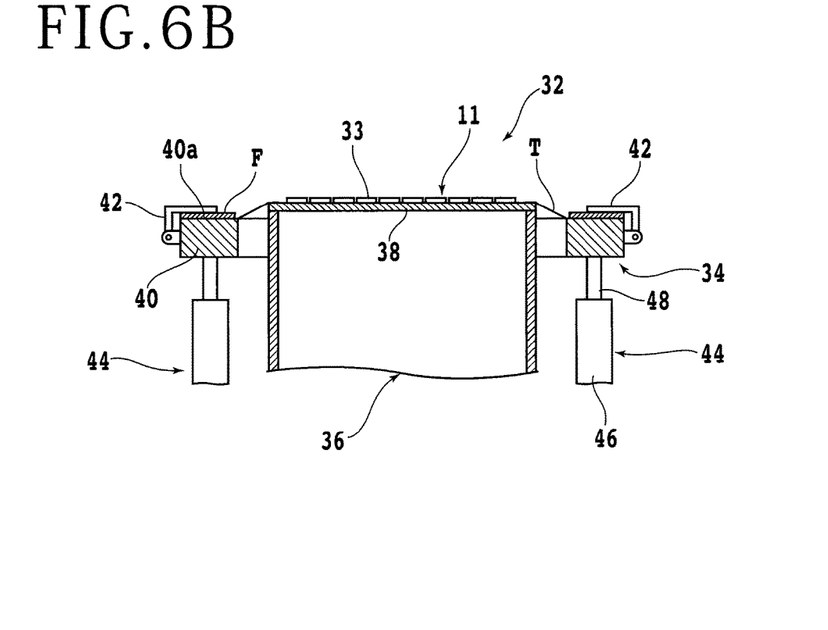

After performing the tape changing step, an expanding step is performed to increase the spacing between the adjacent semiconductor device chips 33 by using an expanding apparatus 32 shown in FIGS. 6A and 6B. The expanding apparatus 32 includes frame holding means 34 for holding the annular frame F of the frame unit 30 and a cylindrical drum 36 provided inside the frame holding means 34. The upper end of the cylindrical drum 36 is closed by a cover plate 38.

The frame holding means 34 is composed of an annular frame holding member 40 and a plurality of clamps 42 as fixing means provided on the outer circumference of the frame holding member 40. The frame holding member 40 has an upper surface as a mounting surface 40a for mounting the annular frame F thereon. That is, the annular frame F of the frame unit 30 is adapted to be mounted on the mounting surface 40a of the frame holding member 40.

The expanding apparatus 32 further includes driving means 44 for vertically moving the annular frame holding member 40. The driving means 44 is composed of a plurality of air cylinders 46, each having a piston rod 48 connected to the frame holding member 40. When the air cylinders 46 are operated, the frame holding member 40 is vertically moved between a reference position where the mounting surface 40a is at the same level as that of the upper surface of the cover plate 38 mounted on the upper end of the cylindrical drum 36 and an expansion position where the mounting surface 40a is lower in level than the upper surface of the cover plate 38 by a predetermined amount.

In performing the expanding step, the annular frame F supporting the wafer 11 through the expansion tape T is mounted on the mounting surface 40a of the frame holding member 40 and then fixed to the frame holding member 40 by the clamps 42 as shown in FIG. 6A. At this time, the mounting surface 40a of the frame holding member 40 is set at the reference position of the same level as that of the upper surface of the cylindrical drum 36. Thereafter, the air cylinders 46 are operated to lower the frame holding member 40 to the expansion position shown in FIG. 6B. Accordingly, the annular frame F fixed to the mounting surface 40a of the frame holding member 40 is also lowered, so that the expansion tape T supported to the annular frame F comes into abutment against the upper surface of the cylindrical drum 36 and is expanded mainly in the radial direction.

As a result, a tensile force is radially applied to the wafer 11 attached to the expansion tape T, so that the spacing between the adjacent semiconductor device chips 33 is increased. Thereafter, each semiconductor device chip 33 is picked up from the expansion tape T by using a pickup apparatus (not shown).

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A semiconductor device chip manufacturing method comprising:
   a device forming step of forming a plurality of devices on a front side of a wafer formed of silicon, the front side of said wafer being partitioned by a plurality of crossing division lines to thereby define a plurality of separate regions where said respective devices are formed;
   a chipping prevention layer forming step of forming a chipping prevention layer at each intersection of said crossing division lines formed on the front side of said wafer;
   a protective tape attaching step of attaching a protective tape to the front side of said wafer after performing said device forming step and said chipping prevention layer forming step;
   a modified layer forming step of applying a laser beam having a transmission wavelength to said wafer to the back side thereof along each division line in the condition where the focal point of said laser beam is set inside said wafer after performing said protective tape attaching step, thereby forming a modified layer inside said wafer along each division line; and a dividing step of grinding the back side of said wafer after performing said modified layer forming step, thereby reducing the thickness of said wafer and also dividing said wafer into individual semiconductor device chips along each division line where said modified layer is formed as a break start point;

wherein said chipping prevention layer functions to prevent the occurrence of chipping due to rubbing of the corners of any adjacent ones of said semiconductor device chips.

2. The semiconductor device chip manufacturing method according to claim 1, wherein said chipping prevention layer is selected from the group consisting of a metal film, nitride film, oxide film, diamond-like carbon film, and passivation film.

3. The semiconductor device chip manufacturing method according to claim 1, wherein said crossing division lines extend so as to be inclined 45 degrees with respect to a notch or orientation flat formed on said wafer.

* * * * *